United States Patent
Chen et al.

(10) Patent No.: US 11,452,373 B2
(45) Date of Patent: *Sep. 27, 2022

(54) BRACKET DEVICE

(71) Applicants: KING SLIDE WORKS CO., LTD., Kaohsiung (TW); KING SLIDE TECHNOLOGY CO., LTD., Kaohsiung (TW)

(72) Inventors: Ken-Ching Chen, Kaohsiung (TW); Shun-Ho Yang, Kaohsiung (TW); Kai-Wen Yu, Kaohsiung (TW); Chiang-Hsueh Fang, Kaohsiung (TW); Chun-Chiang Wang, Kaohsiung (TW)

(73) Assignees: KING SLIDE WORKS CO., LTD., Kaohsiung (TW); KING SLIDE TECHNOLOGY CO., LTD., Kaohsiung (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/147,485

(22) Filed: Jan. 13, 2021

(65) Prior Publication Data
US 2021/0127827 A1 May 6, 2021

Related U.S. Application Data

(62) Division of application No. 15/884,408, filed on Jan. 31, 2018, now Pat. No. 10,925,393.

(30) Foreign Application Priority Data

Aug. 28, 2017 (TW) .................. 106129417

(51) Int. Cl.
*A47B 57/54* (2006.01)
*H05K 7/14* (2006.01)
(Continued)

(52) U.S. Cl.
CPC .......... *A47B 57/545* (2013.01); *A47B 57/485* (2013.01); *A47B 96/07* (2013.01);
(Continued)

(58) Field of Classification Search
CPC .......... F16M 13/02; B25H 1/00; A47B 81/00; A47B 57/545; A47B 57/485; A47B 96/07;
(Continued)

(56) References Cited

U.S. PATENT DOCUMENTS 943,052 A 12/1909 Tunis
7,017,955 B1 3/2006 Chiang
(Continued)

FOREIGN PATENT DOCUMENTS

CN 107637985 A 1/2018
EP 3 202 283 A1 8/2017
JP 2017-70704 A 4/2017

*Primary Examiner* — Kimberly T Wood
(74) *Attorney, Agent, or Firm* — Winston Hsu

(57) ABSTRACT

A bracket device includes a bracket and a fastening member. The fastening member is pivoted to the bracket by a shaft member. The bracket includes a first structure, and the fastening member includes a second structure. When the fastening member is located at a locked position, the second structure is in cooperation with the first structure, so as to prevent the fastening member from tilting relative to the bracket. One of the first structure and the second structure is a protruding portion, and the other one of the first structure and the second structure is a hole or a recessed portion.

7 Claims, 9 Drawing Sheets

(51) Int. Cl.
*A47B 57/48* (2006.01)
*A47B 96/07* (2006.01)
*A47B 57/34* (2006.01)

(52) U.S. Cl.
CPC ............. H05K 7/14 (2013.01); H05K 7/1489 (2013.01); *A47B 57/34* (2013.01)

(58) Field of Classification Search
CPC ......... A47B 57/34; A47F 5/0006; A47G 1/20; H05K 7/14; H05K 7/1489
See application file for complete search history.

(56) References Cited

U.S. PATENT DOCUMENTS

| | | |
|---|---|---|
| 7,357,362 B2 | 4/2008 | Yang |
| 7,552,899 B2 * | 6/2009 | Chen ...................... A47B 88/43 248/220.21 |
| 8,371,454 B2 | 2/2013 | Chen |
| 8,770,528 B2 | 7/2014 | Chen |
| 9,237,808 B2 | 1/2016 | Chen |
| 9,370,120 B2 | 6/2016 | Chen |
| 9,480,183 B2 | 10/2016 | Chen |
| 9,629,460 B1 | 4/2017 | Chen |
| 9,681,573 B2 | 6/2017 | Chen |
| 9,801,467 B2 | 10/2017 | Chen |
| 10,085,561 B2 | 10/2018 | Chen |
| 10,292,297 B2 | 5/2019 | Chen |
| 10,292,493 B2 | 5/2019 | Chen |
| 10,342,336 B2 * | 7/2019 | Chen .................... H05K 7/1489 |
| 2008/0067907 A1 | 3/2008 | Chen |
| 2011/0192946 A1 | 8/2011 | Yu |
| 2011/0290746 A1 | 12/2011 | Lu |
| 2012/0292274 A1 | 11/2012 | Lin |
| 2013/0056432 A1 | 3/2013 | Lin |
| 2013/0119215 A1 | 5/2013 | Chen |
| 2014/0363109 A1 | 12/2014 | Chen |
| 2015/0069196 A1 | 3/2015 | Chen |
| 2015/0089821 A1 | 4/2015 | Troudt |
| 2015/0201754 A1 * | 7/2015 | Chen ...................... A47B 96/07 248/219.3 |
| 2018/0070724 A1 | 3/2018 | Chen |
| 2018/0084908 A1 | 3/2018 | Chen |

* cited by examiner

BRACKET DEVICE

CROSS REFERENCE TO RELATED APPLICATIONS

This application is a divisional application of U.S. application Ser. No. 15/884,408, filed on Jan. 31, 2018. This application claims the benefit of U.S. application Ser. No. 15/884,408, which was filed on Jan. 31, 2018, and is incorporated herein by reference.

BACKGROUND OF THE INVENTION

1. Field of the Invention

The present invention relates to a bracket device, and more particularly, to a bracket device adapted to a slide rail and a rack system.

2. Description of the Prior Art

As shown in FIG. 1, a carried object 100 is conventionally mounted to a rack 104 by a slide rail 102 or a slide rail assembly in a rack system, wherein the slide rail 102 is equipped with a bracket device 106, which is configured to mount the slide rail 102 to the rack 104.

Furthermore, the bracket device 106 includes a bracket 108 and a fastening member 110, wherein the fastening member 110 is pivoted to the bracket 108 by a shaft member 112, and the fastening member 110 is able to pivot relative to the bracket 108 to a locked position P. When the fastening member 110 is located at the locked position P, a first engaging feature 114 of the fastening member 110 is engaged with a second engaging feature 116 of the carried object 100, such that the carried object 100 is retained at a position.

However, the fastening member 110 is pivoted to the bracket 108 by the shaft member 112 being disposed through a pivotal hole 118 of the bracket 108. In practical application, a hole size of the pivotal hole 118 is greater than a diameter of the shaft member 112 for specific purpose, such that the fastening member 110 is movable along a direction D with respect to the bracket 108 via the shaft member 112.

In such a manner, when the second engaging feature 116 of the carried object 100 is engaged with the first engaging feature 114, the fastening member 110 will vibrate up and down or be tilted by an external force F accidentally applied thereon, as shown in FIG. 2, which results in that the second engaging feature 116 of the carried object 100 is unable to engage with the first engaging feature 114 of the fastening member 110. Alternatively, the aforesaid issue occurs due to tolerance between the shaft member 112 and the pivotal hole 118 of the bracket 108.

Thus, how to develop a reliable bracket device has become an issue.

SUMMARY OF THE INVENTION

The present invention provides a bracket device with capability of enhancing stability of a fastening member as being retained at a position.

According to an embodiment of the present invention, a bracket device comprises a bracket and a fastening member. The bracket comprises a side wall and at least one mounting member adjacent to the side wall. The fastening member is pivoted to the bracket by a shaft member. When the fastening member is located at a position, a fastening portion of the fastening member is adjacent to the at least one mounting member. When the fastening member is not located at the position, the fastening portion of the fastening member is away from the at least one mounting member. The bracket comprises a first structure, and the fastening member comprises a second structure. When the fastening member is located at the position, the second structure is in cooperation with the first structure, so as to be configured to prevent the fastening member from moving along an axis direction of the shaft member. One of the first structure and the second structure is a protruding portion, and the other one of the first structure and the second structure is a hole or a recessed portion.

According to another embodiment of the present invention, a bracket device comprises a bracket and a fastening member. The fastening member is pivoted to the bracket by a shaft member. The bracket comprises a first structure, and the fastening member comprises a second structure. When the fastening member is located at a locked position, the second structure is in cooperation with the first structure, so as to prevent the fastening member from tilting relative to the bracket. One of the first structure and the second structure is a protruding portion, and the other one of the first structure and the second structure is a hole or a recessed portion.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
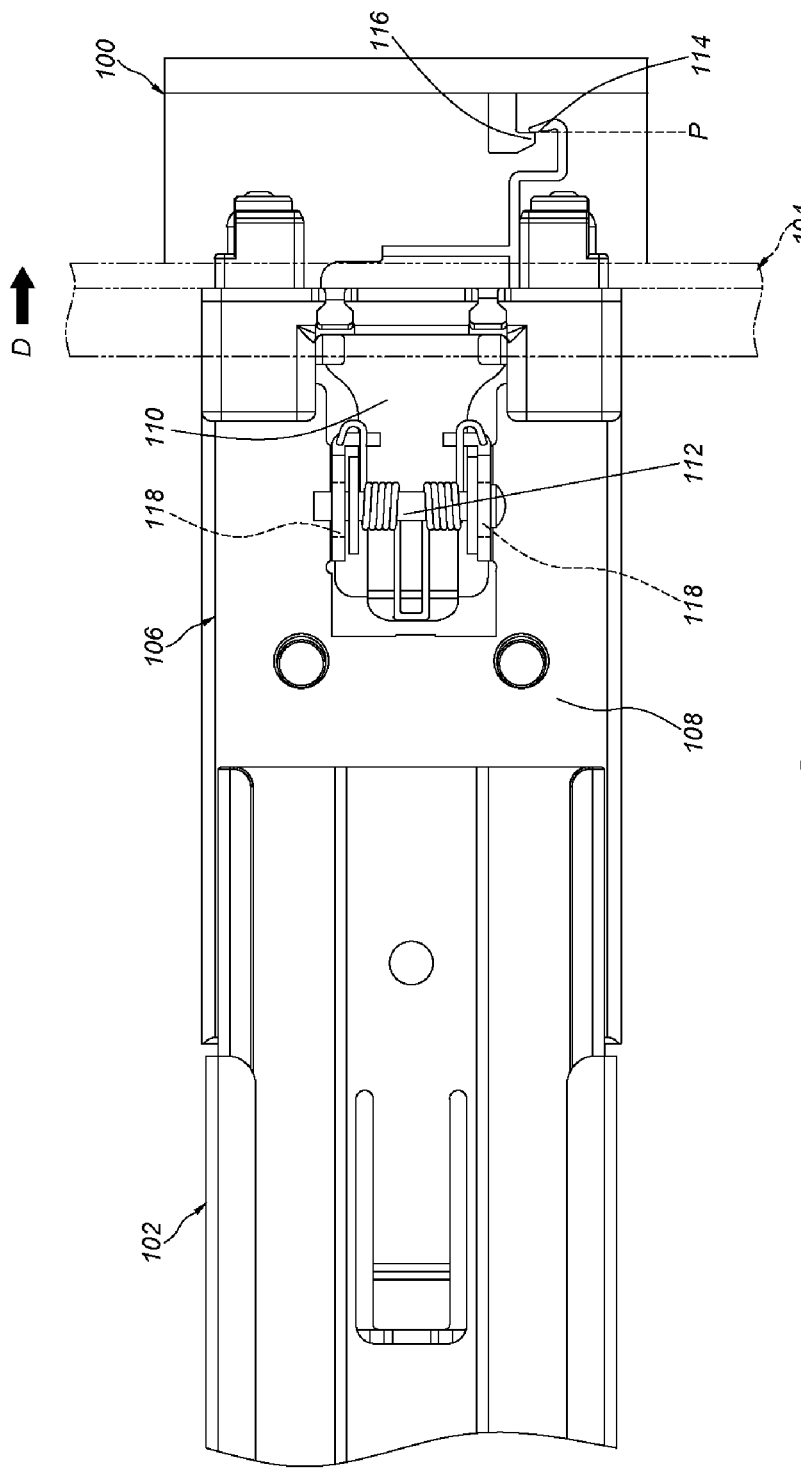
FIG. 1 is a diagram illustrating a bracket device of a slide rail being adapted to a rack and engaged with a carried object in the prior art.
Figure 2:
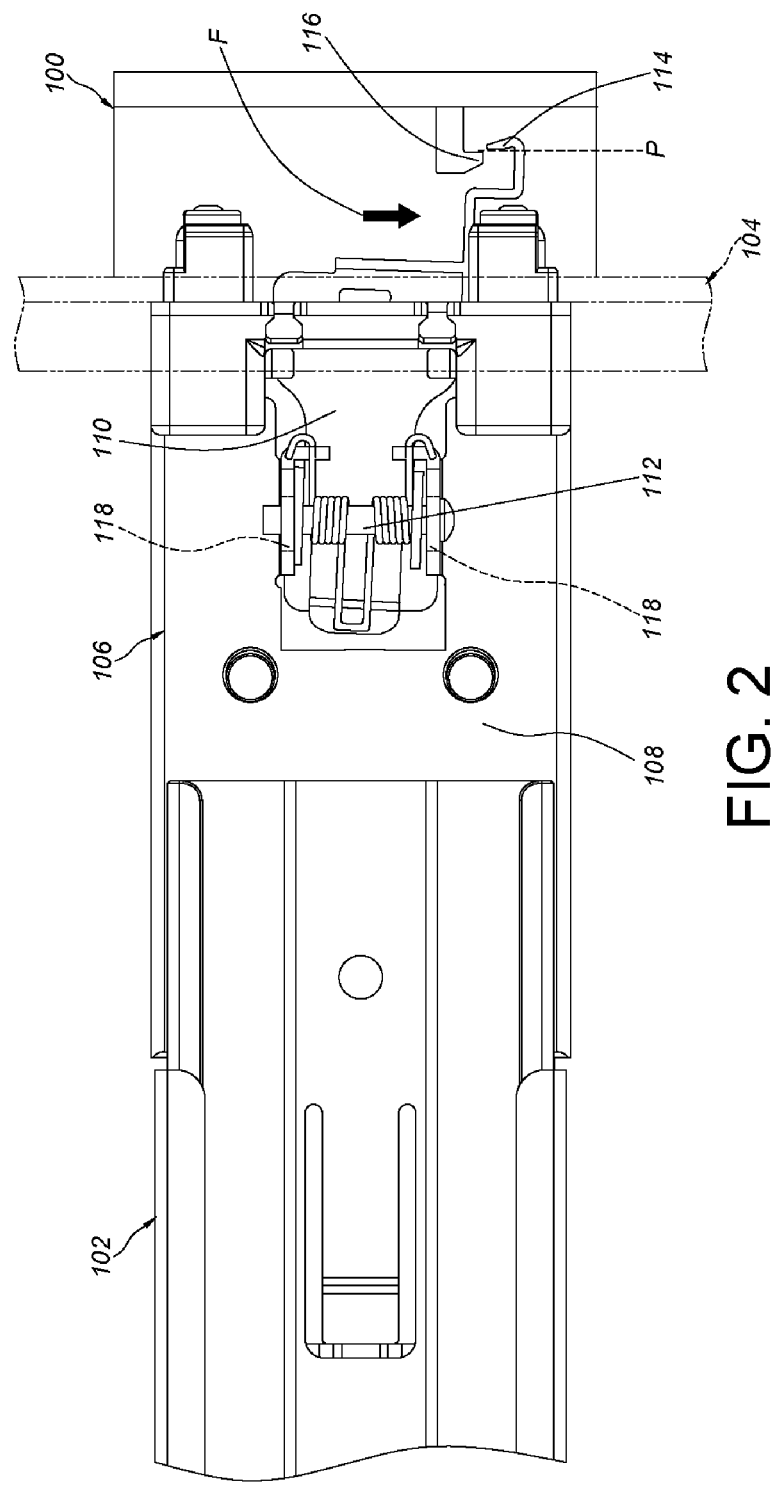
FIG. 2 is a diagram illustrating the bracket device of the slide rail being adapted to the rack and disengaged from the carried object in the prior art.
Figure 3:
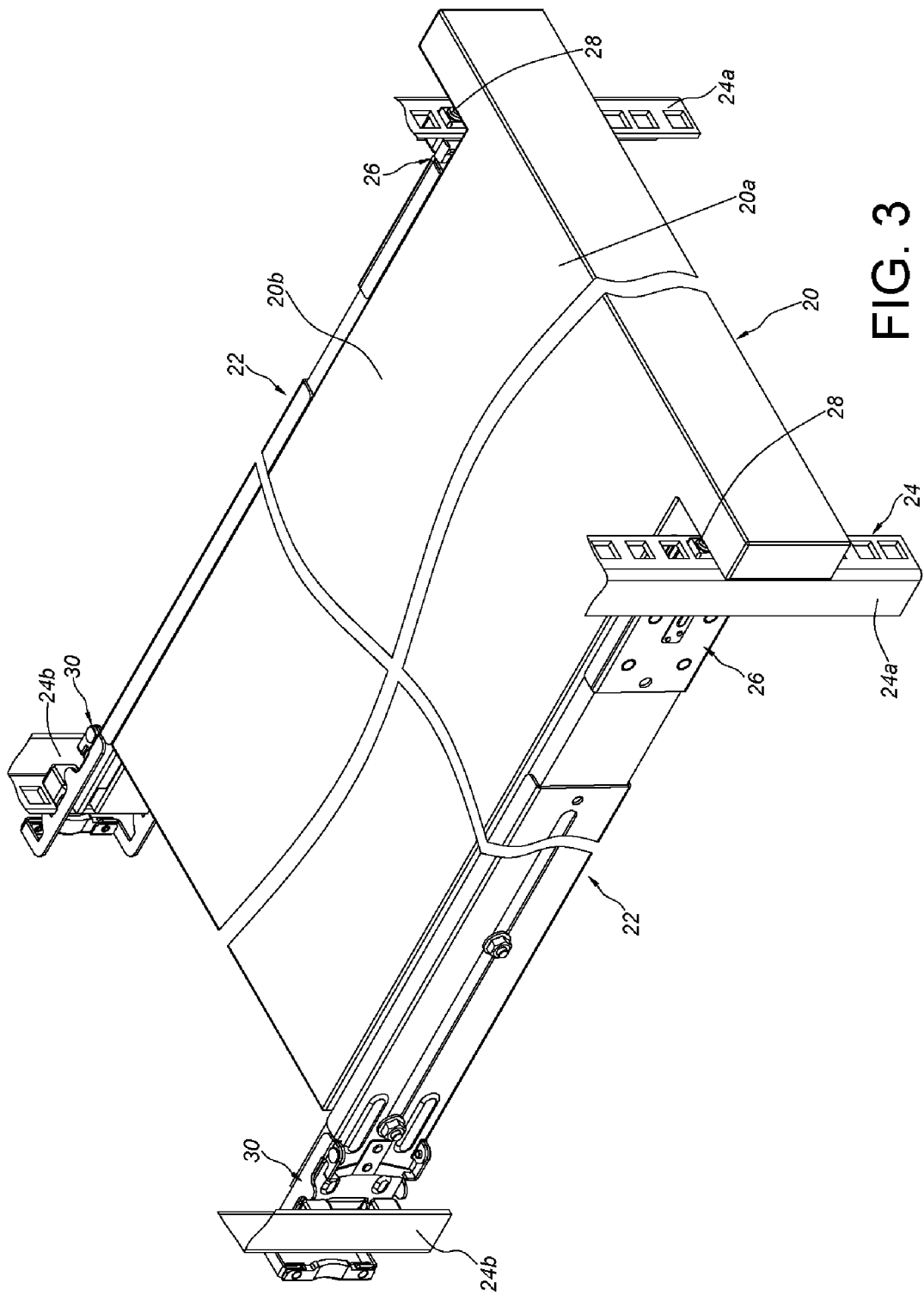
FIG. 3 is a schematic diagram illustrating a carried object being mounted to a rack by a slide rail and a bracket device according to a first embodiment of the present invention.

As shown in FIG. 3, a carried object 20 is mounted to a rack 24 by a slide rail 22 (or a slide rail assembly). In the present invention, the carried object 20 can be an electronic apparatus or a chassis. Hereinafter, it is illustrative that the carried object 20 includes a first portion 20a and a second portion 20b, and a width of the first portion 20a is greater than a width of the second portion 20b.

Furthermore, each of the slide rail 22 is mounted to a first post 24a of the rack 24 by a mounting member 28 of a bracket device 26 and mounted to a second post 24b of the rack 24 by another bracket device 30.

Figure 4:
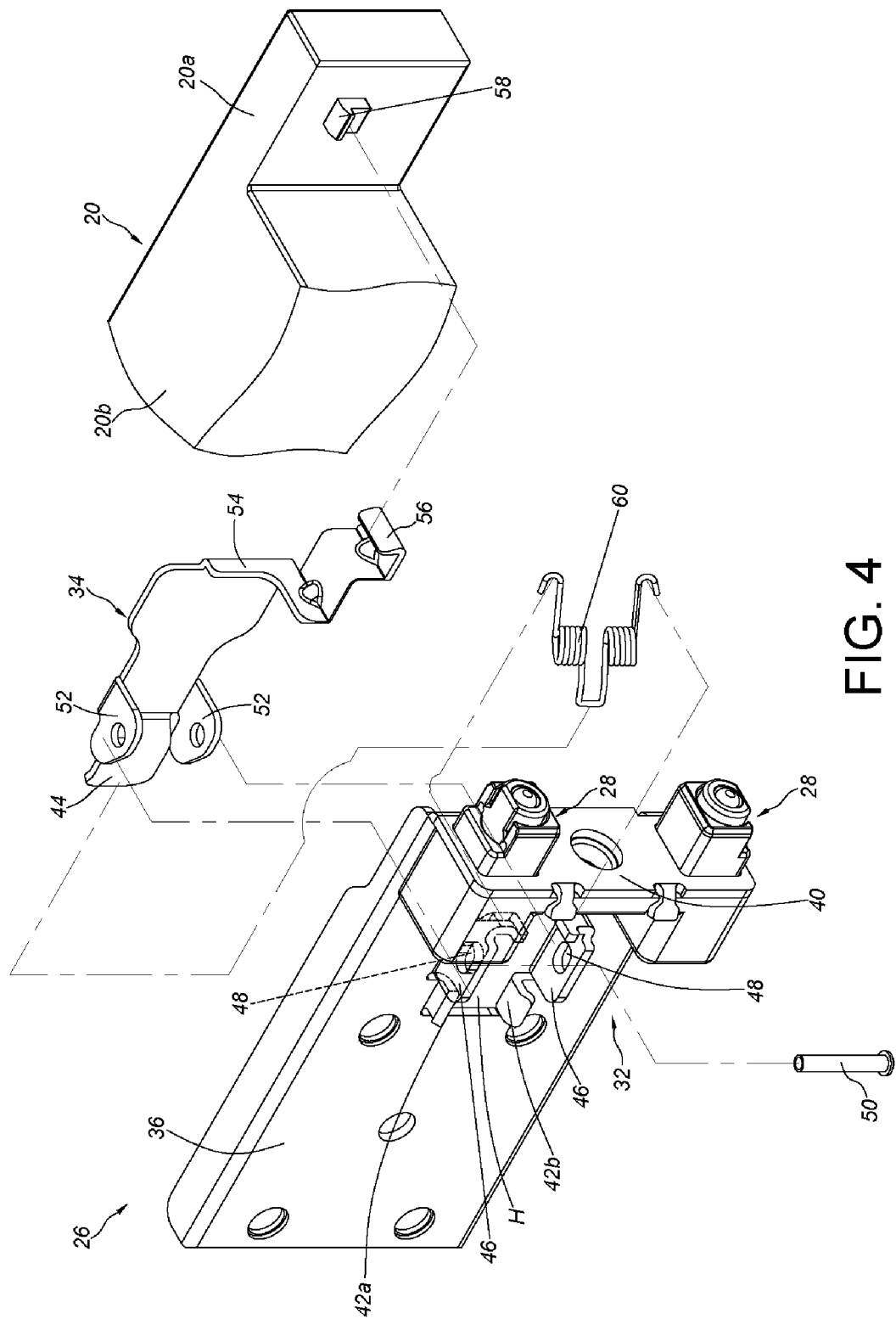
FIG. 4 is an exploded diagram of the bracket device according to the first embodiment of the present invention.
Figure 5:
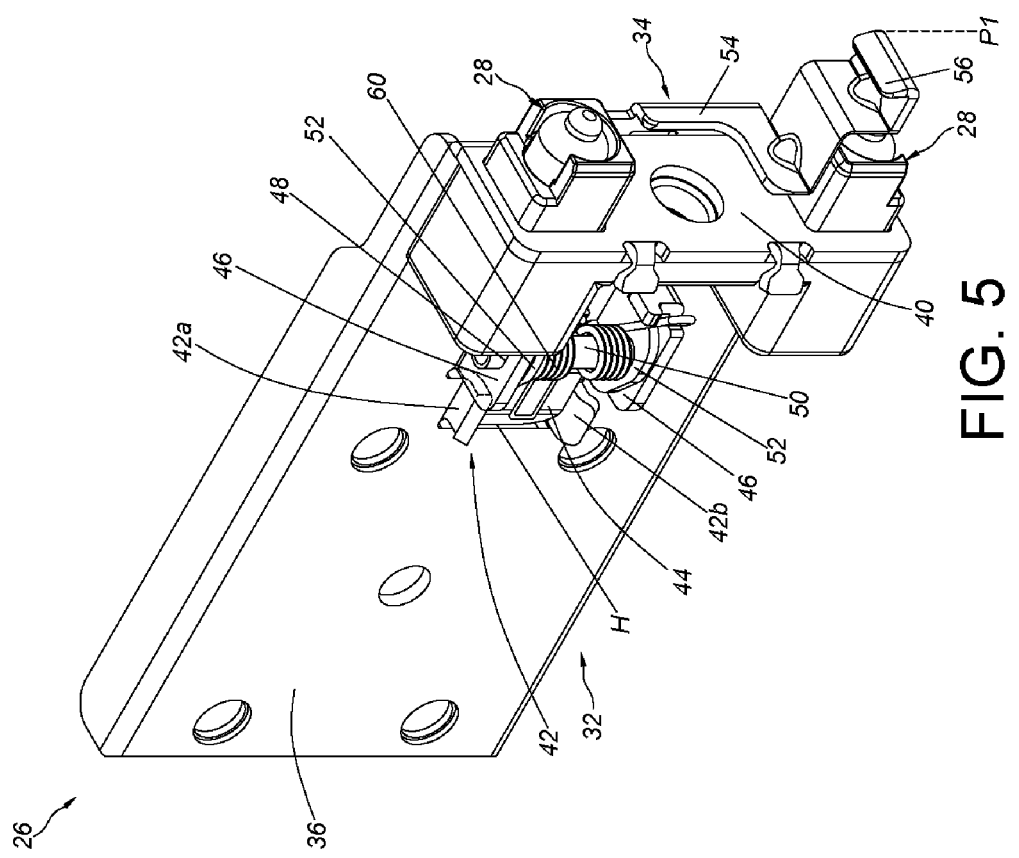
FIG. 5 is a diagram of a fastening portion of the bracket device in a locked status according to the first embodiment of the present invention.

As shown in FIG. 4 and FIG. 5, the bracket device 26 includes a bracket 32 and a fastening member 34. The fastening member 34 is pivoted to the bracket 32.

The bracket 32 is coupled with the aforesaid slide rail 22. For example, the bracket 32 is securely connected to the aforesaid slide rail 22 in a riveting manner or in a welding manner. In practical, the bracket 32 includes a side wall 36 and at least one mounting member 28. The at least one mounting member 28 is adjacent to the side wall 36. Preferably, the bracket 32 further includes an edge wall 40. The edge wall 40 is substantially perpendicularly connected to the side wall 36, and the at least one mounting member 28 is disposed on the edge wall 40.

In the present first embodiment, the bracket 32 includes a first structure 42, and the fastening member 34 includes a second structure 44. The first structure 42 includes two protruding portions 42a, 42b. The two protruding portions 42a, 42b laterally protrude from the side wall 36, and the second structure 44 is an extended wall of the fastening member 34. The second structure 44 is arranged between the two protruding portions 42a, 42b. Preferably, the side wall 36 of the bracket 32 has an opening H, and the two protruding portions 42a, 42b are disposed on an upper side and a lower side of the opening H, respectively. On the other hand, the second structure 44 is located corresponding to the opening H.

Preferably, the bracket 32 further includes at least one protruded lug 46. The at least one protruded lug 46 is disposed on the side wall 36, and the at least one protruded lug 46 has a guiding feature 48. The guiding feature 48 is oriented identically to a length direction of the side wall 36 (or the aforesaid slide rail 22). Hereinafter, it is illustrative of an example that the guiding feature 48 is an elongated hole oriented longitudinally. On the other hand, the fastening member 34 is pivoted to the bracket 32. In the present invention, the fastening member 34 is pivoted to the guiding feature 48 by a shaft member 50 being disposed through a portion of the guiding feature 48. For example, a size of the guiding feature 48 is slightly greater than a diameter of the shaft member 50, such that not only the fastening member 34 is able to pivot relative to the bracket 32 by the shaft member 50, but also the fastening member 34 is able to move relative to the side wall 36 of the bracket 32 along the guiding feature 48.

Furthermore, the fastening member 34 includes at least one connecting portion 52, a fastening portion 54 and an engaging feature 56. The at least one connecting portion 52 is disposed between the second structure 44 and the fastening portion 54, such that the shaft member 50 is disposed through the at least one connecting portion 52 and the at least one protruded lug 46. The engaging feature 56 is adjacent to the fastening portion 54. For example, the engaging feature 56 is a hook, and the engaging feature 56 is connected to the fastening portion 54 and disposed adjacent to a front end of the fastening portion 54. The engaging feature 56 is configured to be engaged with another engaging feature 58 of the carried object 20 (or called target object) mounted to the aforesaid slide rail 22. Preferably, the bracket device 26 further includes a resilient member 60. The resilient member 60 is configured to provide the fastening member 34 with a resilient force.

Figure 6:
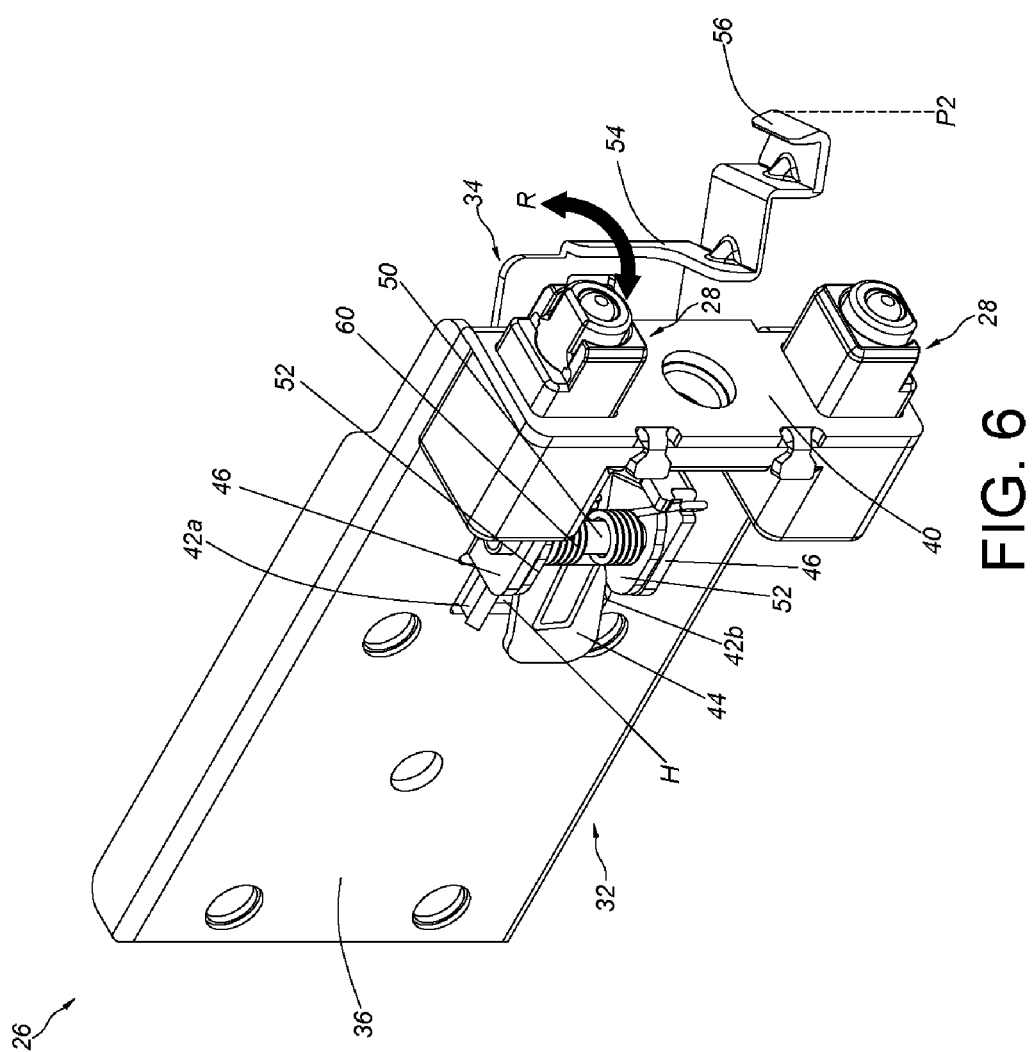
FIG. 6 is a diagram of the fastening portion of the bracket device in an unlocked status according to the first embodiment of the present invention.

As shown in FIG. 5 and FIG. 6, the fastening member 34 is able to be moved from a locked position P1 (i.e., a position) to an unlocked position P2 (i.e., another position) along a pivoting direction R, or alternatively, from the unlocked position P2 to the locked position P1. Preferably, the fastening member 34 is forced to retain at the locked position P1 by the resilient force provided by the resilient member 60.

When the fastening member 34 is at the locked position P1, the fastening portion 54 of the fastening member 34 is adjacent to the at least one mounting member 28, as shown in FIG. 5. When the fastening member 34 is not at the locked position P1, e.g., when the fastening member 34 is at the unlocked position P2, the fastening portion 54 of the fastening member 34 is away from the at least one mounting member 28, as shown in FIG. 6.

Figure 7:
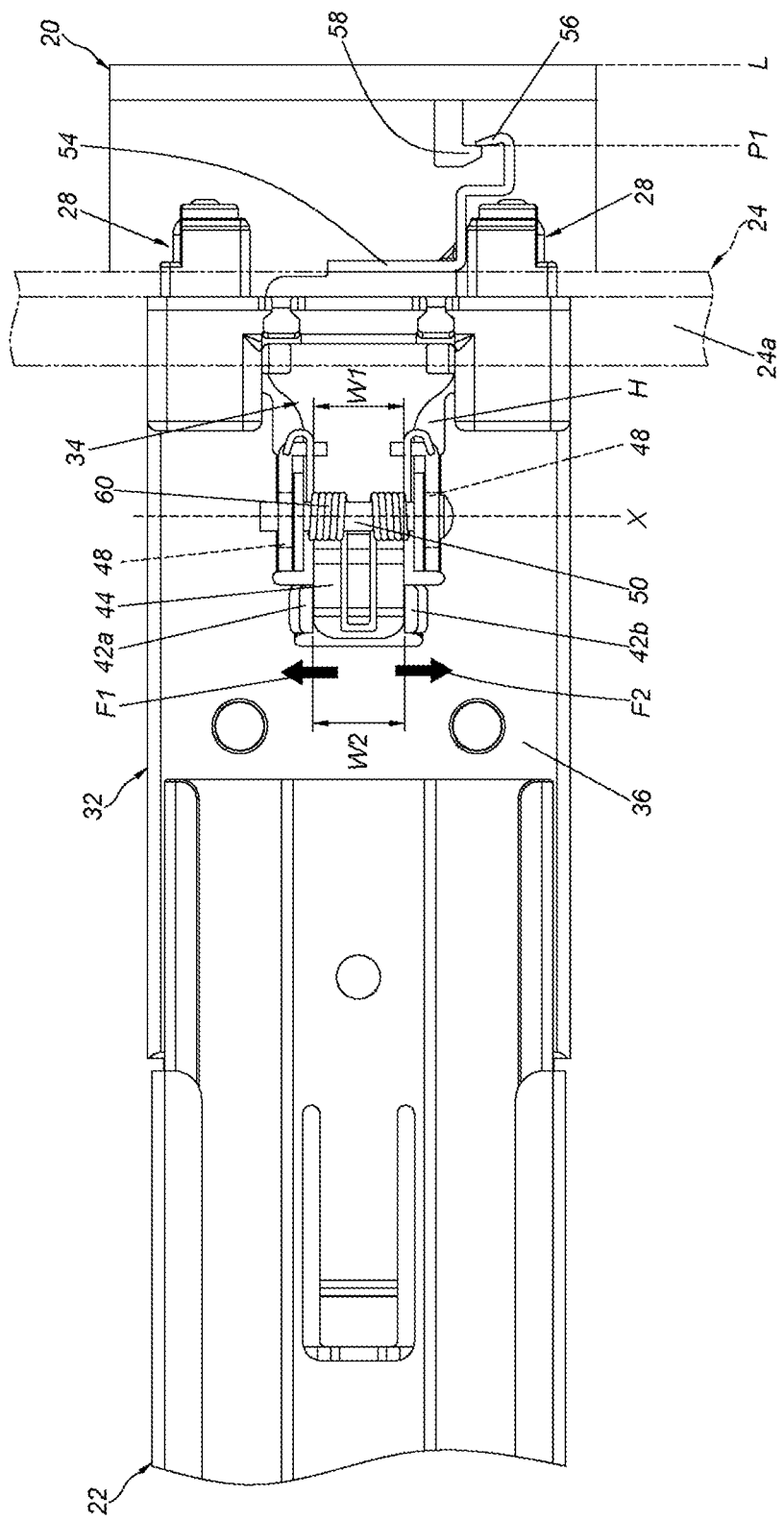
FIG. 7 is a diagram of the bracket device of the slide rail implemented in the rack according to the first embodiment of the present invention.

As shown in FIG. 7, when the slide rail 22 is mounted to the first post 24a of the rack 24 by the at least one mounting member 28 of the bracket 32 and the fastening member 34 is at the locked position P1, the fastening portion 54 of the fastening member 34 is used for locking the first post 24a, and the engaging feature 56 of the fastening member 34 is used for being engaged with the other engaging feature 58 of the carried object 20 as the carried object 20 is illustrative of being at a retracted position L via the slide rail 22.

In practical, when the fastening member 34 is at the locked position P1, the second structure 44 is in cooperation with the first structure 42, so as to prevent the fastening member 34 from moving along an axis direction X of the shaft member 50. In other words, the second structure 44 and the first structure 42 are able to prevent the fastening member 34 from moving along a height direction relative to a longitudinal direction of the side wall 36 or the slide rail 22.

For example, when the fastening member 34 is at the locked position P1, an external force F1 or F2 is accidentally applied on the fastening member 34, it is able to prevent the fastening member 34 from moving upwards or downwards that the second structure 44 is abutted between the two protruding portions 42a, 42b. In other words, the two protruding portions 42a, 42b of the first structure 42 in cooperation with the second structure 44 are able to prevent the fastening member 34 from moving upwards, downwards or along a tilted direction relative to the side wall 36 of the bracket 32.

In summary, when the fastening member 34 is at the locked position P1, the aforesaid configuration ensures that the engaging feature 56 of the fastening member 34 is engaged with the other engaging feature 58 of the carried object 20. One of the advantages of the aforesaid configuration is to prevent the fastening member 34 from disengaging from the carried object 20.

As shown in FIG. 7, it should be noticed that a first width W1 is defined between the two protruding portions 42a, 42b of the first structure 42 of the bracket 32, a second width W2 of the second structure 44 of the fastening member 34 is defined along a height direction relative to a longitudinal direction of the bracket 32, and the second width W2 is substantially identical to the first width W1. As a result, the second structure 44 can be constrained between the two protruding portions 42a, 42b of the first structure 42, and the two protruding portions 42a, 42b of the first structure 42 are able to prevent the second structure 44 from moving upwards, downwards or along a tilted direction relative to the bracket 32.

Figure 8:
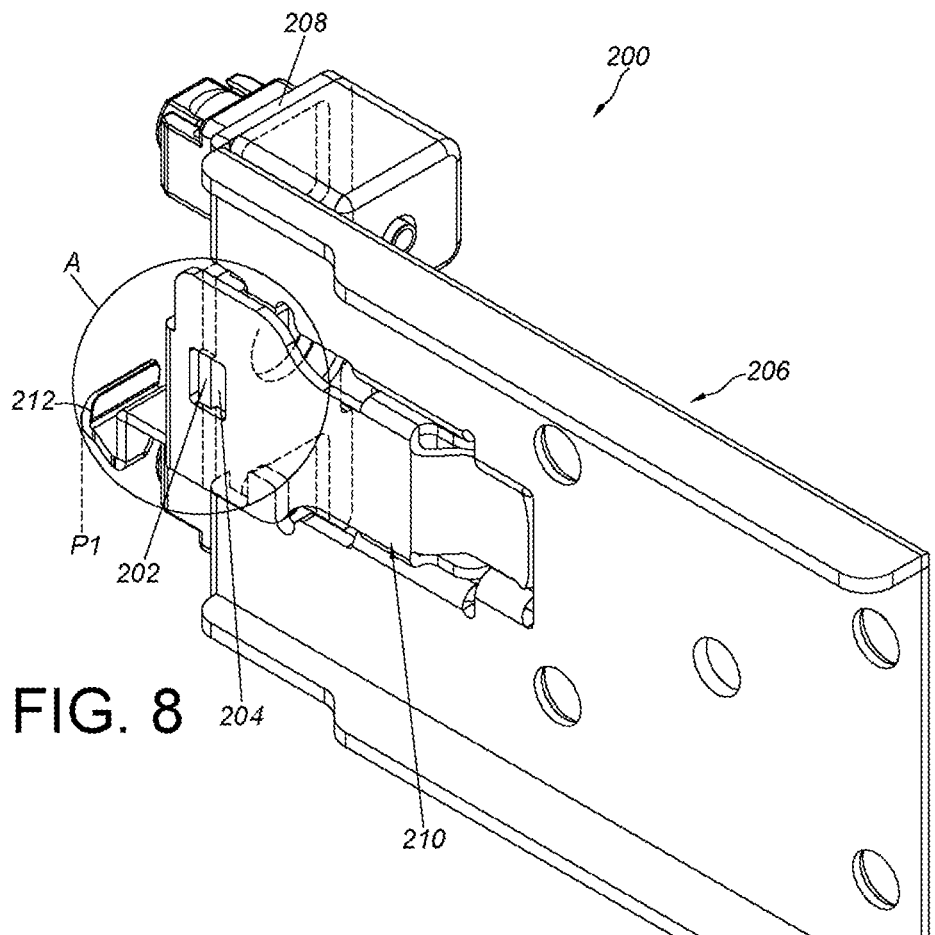
FIG. 8 is a diagram of a bracket device according to a second embodiment of the present invention.
Figure 9:
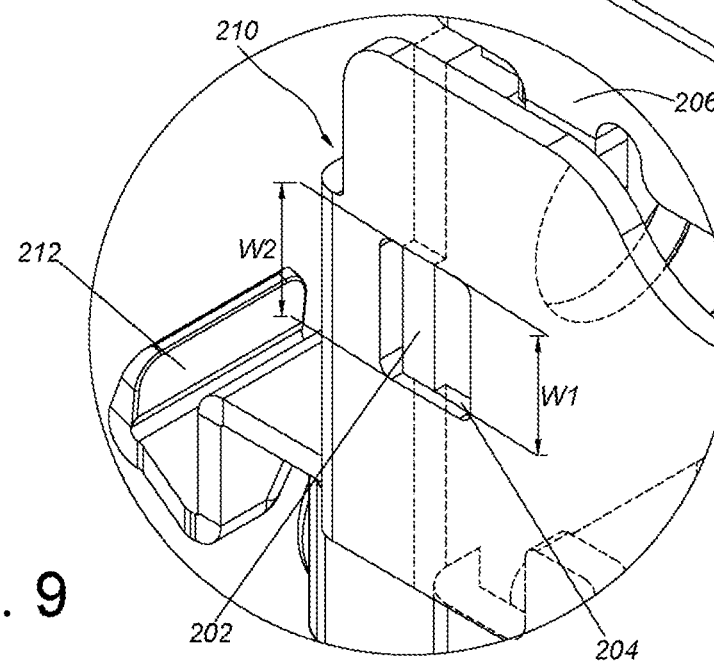
FIG. 9 is an enlarged diagram indicating region A in FIG. 8.

As shown in FIG. 8 and FIG. 9, the major difference between the bracket device 200 in the second embodiment and that in the first embodiment is the configuration of the first structure and the second structure.

The first structure 202 and the second structure 204 of the bracket device 200 are a combination of a protruding portion and a hole. In practical, the bracket 206 includes a first structure 202. For example, the first structure 202 is illustrative of a protruding portion adjacent to the edge wall 208. On the other hand, the fastening member 210 includes a second structure 204, and the second structure 204 is illustrative of a hole. The hole is for accommodating the protruding portion, such that the protruding portion is constrained by inner walls of the hole. In such a manner, the combination of the first structure 202 (i.e., the protruding portion) and the second structure 204 (i.e., the hole) is able to prevent the fastening member 210 from moving upwards, downwards or along a tilted direction relative to the bracket 206. In an alternative embodiment, the first structure 202 can be a hole, and the second structure 204 can be a protruding portion.

In summary, when the fastening member 210 is at a locked position P1, the aforesaid configuration ensures that an engaging feature 212 of the fastening member 210 is engaged with the other engaging feature 58 of the carried object 20.

As shown in FIG. 9, it should be noticed that a first width W1 is defined by the first structure 202 of the bracket 206 along a height direction relative to a longitudinal direction of the bracket 206, a second width W2 is defined by the second structure 204 of the fastening member 210 along the height direction, and the second width W2 is substantially identical to the first width W1. As a result, the second structure 204 (i.e., the hole) can accommodate the first structure 202 (i.e., the protruding portion), and the second structure 204 (i.e., the hole) is able to prevent the first structure 202 (i.e., the protruding portion) from moving upwards, downwards or along a tilted direction relative to the bracket 206.

Figure 10:
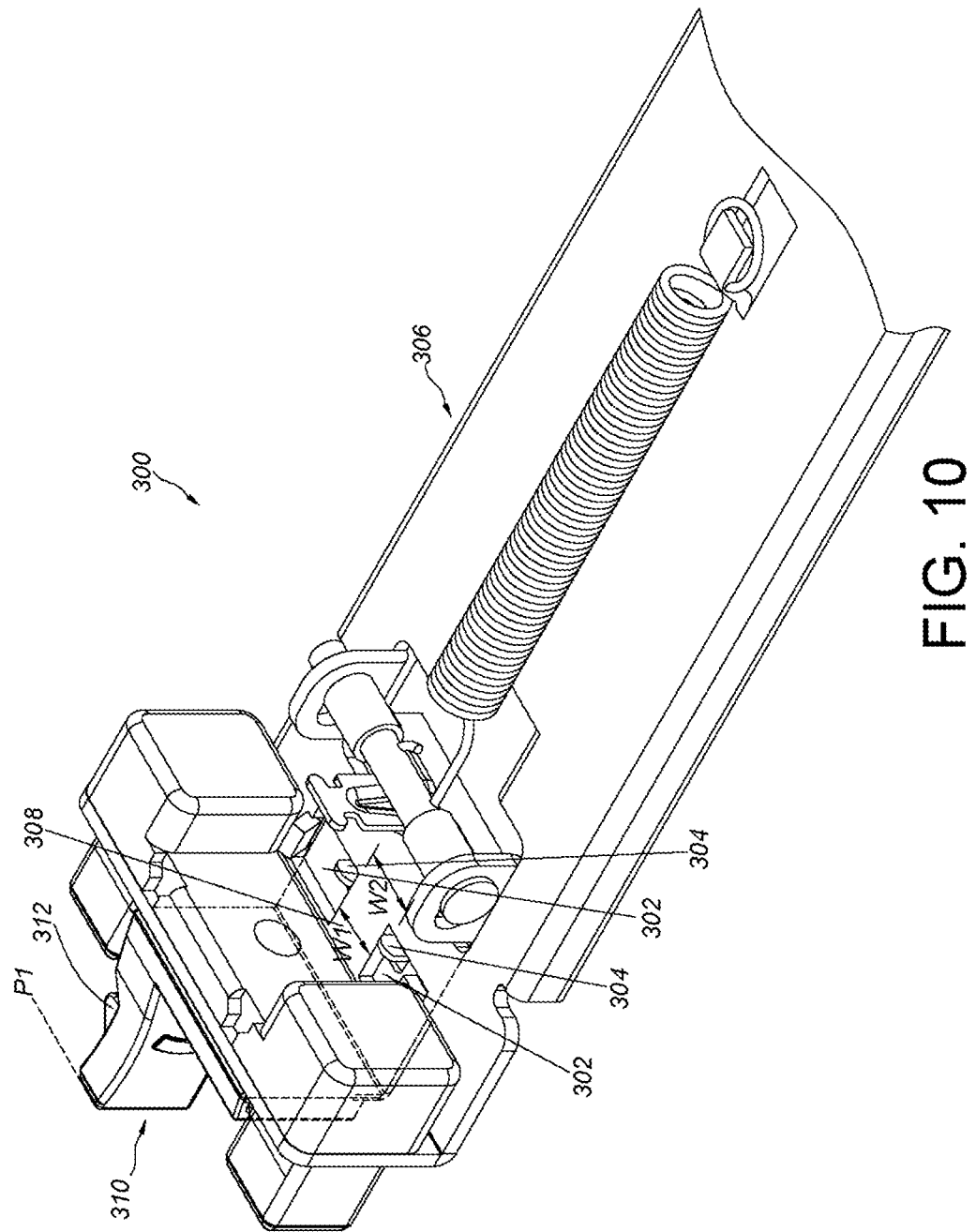
FIG. 10 is a diagram of a bracket device according to a third embodiment of the present invention.

As shown in FIG. 10, the major difference between the bracket device 300 in the third embodiment and that in the second embodiment is the configuration of the first structure and the second structure.

The first structure 302 and the second structure 304 of the bracket device 300 are a combination of a protruding portion and a hole. In practical, the bracket 306 includes a first structure 302. The first structure 302 is illustrative of a hole disposed on the side wall 308 of the bracket 306. On the other hand, the fastening member 310 includes the second structure 304. The second structure 304 is illustrative of a protruding portion configured to be inserted in the hole, such that the protruding portion is constrained by inner walls of the hole. In such a manner, the combination of the first structure 302 (i.e., the hole) and the second structure 304 (i.e., the protruding portion) is able to prevent the fastening member 310 from moving upwards, downwards or along a tilted direction relative to the bracket 306. In an alternative embodiment, the first structure 302 can be a protruding portion, and the second structure 304 can be a hole.

In summary, when the fastening member 310 is at a locked position P1, the aforesaid configuration ensures that an engaging feature 312 of the fastening member 310 is engaged with the other engaging feature 58 of the carried object 20.

As shown in FIG. 10, it should be noticed that an amount of the first structure 302 (i.e., the hole) of the bracket 306 is two, and a first width W1 is defined between the two holes (i.e., the first structures 302). An amount of the second structure 304 (i.e., the protruding portion) is two, and a second width W2 is defined between the two protruding portions (i.e., the second structures 304). The second width W2 is substantially identical to the first width W1. As a result, the second structures 304 (i.e., the protruding portions) can respectively engage with the first structures 302 (i.e., the holes), and the first structures 302 (i.e., the holes) are able to prevent the second structures 304 (i.e., the protruding portions) from moving upwards, downwards or along a tilted direction relative to the bracket 306.

As shown in the second embodiment and the third embodiment, the first structure and the second structure can be a combination of a protruding portion and a recessed portion, and related descriptions thereof are omitted herein for simplicity.

In summary, the bracket device of the present invention has an advantage that the second structure and the first structure are configured to cooperatively prevent the fastening member from moving along the axis direction of the shaft member.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A bracket device, comprising:
   a bracket comprising a side wall, an edge wall and at least one mounting member, wherein the edge wall is substantially perpendicularly connected to the side wall, and the at least one mounting member is disposed on the edge wall; and
   a fastening member pivoted to the bracket by a shaft member, wherein when the fastening member is located at a position, a fastening portion of the fastening member is adjacent to the at least one mounting member; when the fastening member is not located at the position, the fastening portion of the fastening member is away from the at least one mounting member;
   wherein the bracket comprises a first structure disposed on the side wall of the bracket, and the fastening member comprises a second structure;
   wherein when the fastening member is located at the position, the second structure is in cooperation with the first structure, so as to be configured to prevent the fastening member from moving along an axis direction of the shaft member;
   wherein one of the first structure and the second structure is a protruding portion, and the other one of the first structure and the second structure is a hole or a recessed portion.

2. A bracket device, comprising:
   a bracket comprising a side wall and at least one mounting member adjacent to the side wall; and
   a fastening member pivoted to the bracket by a shaft member, wherein the fastening member comprises a fastening portion and a side wall substantially perpendicularly connected to the fastening portion;
   wherein the bracket comprises a first structure, and the fastening member comprises a second structure disposed on the side wall of the fastening member;
   wherein when the fastening member is located at a locked position, the fastening portion of the fastening member is adjacent to the at least one mounting member, the second structure is in cooperation with the first structure, so as to prevent the fastening member from tilting relative to the bracket;

wherein one of the first structure and the second structure is a protruding portion, and the other one of the first structure and the second structure is a hole or a recessed portion.

3. The bracket device of claim 1, wherein the fastening member further comprises a side wall substantially perpendicularly connected to the fastening portion, and the second structure is disposed on the side wall of the fastening member.

4. The bracket device of claim 1, wherein a first width is defined by the first structure of the bracket along a height direction relative to a longitudinal direction of the bracket, a second width is defined by the second structure of the fastening member along the height direction, and the second width is substantially identical to the first width.

5. The bracket device of claim 2, wherein the bracket further comprises an edge wall substantially perpendicularly connected to the side wall of the bracket, the at least one mounting member is disposed on the edge wall of the bracket, and the first structure is disposed on the side wall of the bracket.

6. The bracket device of claim 2, wherein a first width is defined by the first structure of the bracket along a height direction relative to a longitudinal direction of the bracket, a second width is defined by the second structure of the fastening member along the height direction, and the second width is substantially identical to the first width.

7. A bracket device, comprising:
a bracket comprising a side wall, an edge wall and at least one mounting member, the edge wall is substantially perpendicularly connected to the side wall, and the at least one mounting member is disposed on the edge wall; and
a fastening member pivoted to the bracket by a shaft member;
wherein the bracket further comprises a first structure disposed on the side wall of the bracket, and the fastening member comprises a second structure;
wherein when the fastening member is located at a locked position, the second structure is in cooperation with the first structure, so as to prevent the fastening member from tilting relative to the bracket;
wherein one of the first structure and the second structure is a protruding portion, and the other one of the first structure and the second structure is a hole or a recessed portion;
wherein a first width is defined by the first structure of the bracket along a height direction relative to a longitudinal direction of the bracket, a second width is defined by the second structure of the fastening member along the height direction, and the second width is substantially identical to the first width.

* * * * *